United States Patent
Cheng et al.

(10) Patent No.: US 10,643,985 B2
(45) Date of Patent: May 5, 2020

(54) CAPACITOR ARRAY OVERLAPPED BY ON-CHIP INDUCTOR/TRANSFORMER

(71) Applicant: QUALCOMM Incorporated, San Diego, CA (US)

(72) Inventors: Haitao Cheng, San Diego, CA (US); Zhang Jin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/004,920

(22) Filed: Jun. 11, 2018

(65) Prior Publication Data

US 2019/0189608 A1      Jun. 20, 2019

Related U.S. Application Data

(60) Provisional application No. 62/599,341, filed on Dec. 15, 2017.

(51) Int. Cl.
| | |
|---|---|
| H01L 23/66 | (2006.01) |
| H01L 23/522 | (2006.01) |
| H01L 27/01 | (2006.01) |
| H01L 21/70 | (2006.01) |
| H01L 49/02 | (2006.01) |
| H01L 29/94 | (2006.01) |

(52) U.S. Cl.
CPC .......... *H01L 27/013* (2013.01); *H01L 21/705* (2013.01); *H01L 23/5222* (2013.01); *H01L 23/5227* (2013.01); *H01L 23/66* (2013.01); *H01L 28/10* (2013.01); *H01L 28/40* (2013.01); *H01L 28/86* (2013.01); *H01L 28/90* (2013.01); *H01L 29/94* (2013.01)

(58) Field of Classification Search
CPC .................................................... H01L 27/013
See application file for complete search history.

(56) References Cited

U.S. PATENT DOCUMENTS

| | | | |
|---|---|---|---|
| 6,072,205 A | 6/2000 | Yamaguchi et al. |
| 6,297,524 B1 | 10/2001 | Vathulya et al. |
| 7,495,566 B2 | 2/2009 | Jorgensen et al. |
| 7,811,919 B2 | 10/2010 | Daley et al. |

(Continued)

FOREIGN PATENT DOCUMENTS

| | | |
|---|---|---|
| JP | H06333740 A | 12/1994 |
| JP | 2012199424 A | 10/2012 |

(Continued)

OTHER PUBLICATIONS

International Search Report and Written Opinion—PCT/US2018/056098—ISA/EPO—dated Jan. 28, 2019.

*Primary Examiner* — William A Harriston
(74) *Attorney, Agent, or Firm* — Qualcomm Incorporated/Seyfarth Shaw LLP

(57) ABSTRACT

An integrated circuit (IC) includes a capacitor array in at least one first back-end-of-line (BEOL) interconnect level. The capacitor array includes a pair of capacitor manifolds coupled to parallel capacitor routing traces and capacitors coupled between each pair of parallel capacitor routing traces. The IC also includes an inductor trace having at least one turn in at least one second BEOL interconnect level. The inductor trace defines a perimeter to overlap at least a portion of the capacitor array.

20 Claims, 9 Drawing Sheets

(56) References Cited

U.S. PATENT DOCUMENTS

| | | |
|---|---|---|
| 7,906,831 B2 | 3/2011 | Baumgartner et al. |
| 8,169,050 B2 | 5/2012 | Daley et al. |
| 8,441,334 B2 | 5/2013 | Kawano |
| 9,270,247 B2 | 2/2016 | Jing et al. |
| 9,443,843 B2 | 9/2016 | Lee et al. |
| 2007/0268653 A1 | 11/2007 | Kim et al. |
| 2008/0055037 A1 | 3/2008 | Watanabe et al. |
| 2008/0151469 A1 | 6/2008 | Thompson et al. |
| 2009/0032904 A1 | 2/2009 | Chinthakindi et al. |
| 2009/0322447 A1* | 12/2009 | Daley ............... H01L 23/5223 333/185 |
| 2010/0019300 A1 | 1/2010 | Yu et al. |
| 2012/0098621 A1 | 4/2012 | Nathawad |
| 2012/0223796 A1 | 9/2012 | Huang et al. |
| 2013/0043557 A1 | 2/2013 | Cho |
| 2013/0093045 A1 | 4/2013 | Cho |
| 2014/0138792 A1 | 5/2014 | Lo et al. |
| 2014/0167992 A1 | 6/2014 | Aruga |
| 2017/0093362 A1 | 3/2017 | Jin et al. |
| 2017/0149404 A1 | 5/2017 | Tsai et al. |
| 2017/0222613 A1 | 8/2017 | Yehezkely et al. |
| 2018/0102738 A1 | 4/2018 | Bi et al. |
| 2018/0323765 A1 | 11/2018 | Armanious et al. |
| 2019/0007017 A1 | 1/2019 | Yehezkely et al. |
| 2019/0051987 A1 | 2/2019 | Blumberg, Jr. |
| 2019/0200454 A1 | 6/2019 | Liu et al. |
| 2019/0229699 A1 | 7/2019 | Joshi et al. |
| 2019/0259701 A1 | 8/2019 | Cheng et al. |
| 2019/0378793 A1 | 12/2019 | Cheng et al. |

FOREIGN PATENT DOCUMENTS

| | | |
|---|---|---|
| WO | 0178119 A2 | 10/2001 |
| WO | 2005008695 A2 | 1/2005 |
| WO | 2017053120 A1 | 3/2017 |

* cited by examiner

CAPACITOR ARRAY OVERLAPPED BY ON-CHIP INDUCTOR/TRANSFORMER

CROSS-REFERENCE TO RELATED APPLICATION

This application claims the benefit of U.S. Provisional Patent Application No. 62/599,341, filed on Dec. 15, 2017, entitled "CAPACITOR ARRAY OVERLAPPED BY ON-CHIP INDUCTOR/TRANSFORMER," the disclosure of which is expressly incorporated by reference herein in its entirety.

BACKGROUND

Field

Aspects of the present disclosure relate to semiconductor devices and, more particularly, to an on-chip inductor/transformer that overlaps a capacitor array.

Background

Mobile radio frequency (RF) chips (e.g., mobile RF transceivers) have migrated to a deep sub-micron process node due to cost and power consumption considerations. Designing mobile RF transceivers is further complicated by added circuit functions for supporting communication enhancements, such as fifth generation (5G) communication systems. Further design challenges for mobile RF transceivers include using passive devices, which directly affect analog/RF performance considerations, including mismatch, noise, and other performance considerations.

Passive devices may involve high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. MOM capacitors are also known as vertical parallel plate (VPP) capacitors, natural vertical capacitors (NVCAP), lateral flux capacitors, comb capacitors, as well as interdigitated finger capacitors. MOM capacitors exhibit beneficial characteristics including high capacitance density, low parasitic capacitance, superior RF characteristics, and good matching characteristics without additional masks or process steps relative to other capacitor structures.

MOM capacitors are one of the most widely used capacitors due to their beneficial characteristics. MOM capacitor structures realize capacitance by using the fringing capacitance produced by sets of interdigitated fingers. That is, MOM capacitors harness lateral capacitive coupling between plates formed by metallization layers and wiring traces.

The design of mobile RF transceivers may include integrating MOM/MIM/MOS capacitors with inductors and/or transformers. Unfortunately, integrating MOM/MIM/MOS capacitors with inductors and/or transformers may degrade a performance of the inductors and/or transformers.

SUMMARY

An integrated circuit (IC) includes a capacitor array in at least one first back-end-of-line (BEOL) interconnect level. The capacitor array includes a pair of capacitor manifolds coupled to parallel capacitor routing traces and capacitors coupled between each pair of parallel capacitor routing traces. The IC also includes an inductor trace having at least one turn in at least one second BEOL interconnect level. The inductor trace defines a perimeter to overlap at least a portion of the capacitor array.

A method for fabricating a radio frequency integrated circuit (RFIC) is described. The method includes fabricating a capacitor array in at least one first back-end-of-line (BEOL) interconnect level. The method also includes depositing parallel capacitor routing traces. Capacitors of the capacitor array are coupled between each pair of the parallel capacitor routing traces. The method further includes fabricating a pair of capacitor manifolds on a same side of the capacitor array. Each of the pair of capacitor manifolds is coupled to the parallel capacitor routing traces. The method also includes fabricating an inductor trace having at least one turn in at least one second BEOL interconnect level. The inductor trace defines a perimeter to overlap at least a portion of the capacitor array.

A radio frequency integrated circuit (RFIC) includes a capacitor array in at least one first back-end-of-line (BEOL) interconnect level. The capacitor array has a pair of capacitor manifolds on a same side of the capacitor array. Each of the pair of capacitor routing manifolds is coupled to means for routing capacitor fingers. Capacitors are coupled between the means for routing capacitor fingers. The RFIC also includes an inductor trace having at least one turn in at least one second BEOL interconnect level. The inductor trace defines a perimeter to overlap at least a portion of the capacitor array.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
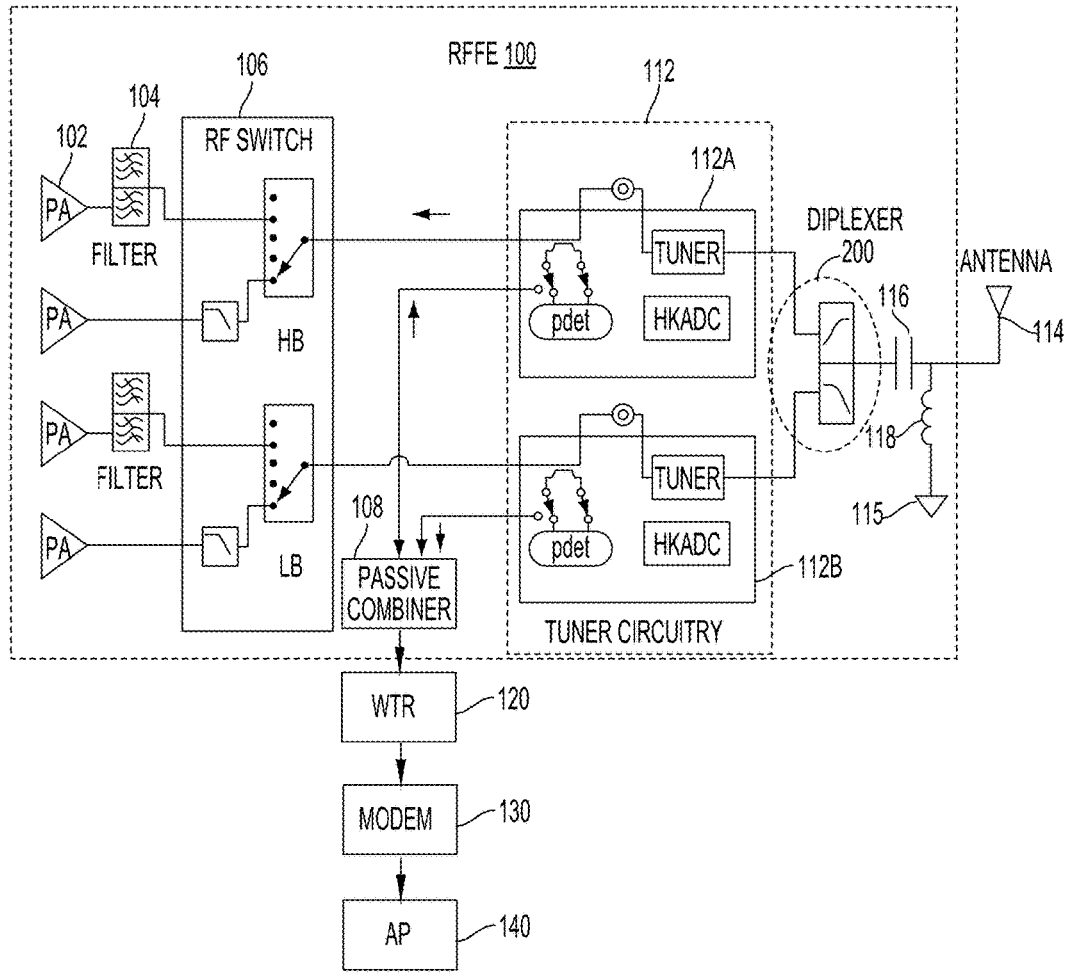
FIG. 1 is a schematic diagram of a radio frequency (RF) front end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile radio frequency (RF) chips (e.g., mobile RF transceivers) have migrated to a deep sub-micron process node due to cost and power consumption considerations. Designing mobile RF transceivers is complicated by added circuit functions for supporting communication enhancements, such as fifth generation (5G) communication systems. Further design challenges for mobile RF transceivers include using passive devices, which directly affect analog/RF performance considerations, including mismatch, noise, and other performance considerations.

Passive devices in mobile RF transceivers may include high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material.

These parallel plate capacitors consume a large area on a semiconductor chip because many designs place the capacitor over the substrate of the chip. Unfortunately, this approach reduces the available area for active devices. Another approach is to create a vertical structure, which may be known as a vertical parallel plate (VPP) capacitor. VPP capacitor structures may be created through stacking of the interconnect layers on a chip.

VPP capacitors structures, however, have lower capacitive storage, or lower "density," in that these structures do not store much electrical charge. In particular, the interconnect and via layer interconnect traces used to fabricate VPP capacitors may be very small in size. The spacing between the interconnects and via layer conductive traces in VPP structures is limited by design rules, which often results in a large area for achieving certain desired capacitance for such structures. Although described as "vertical," these structures can be in any direction that is substantially perpendicular to the surface of the substrate, or at other angles that are not substantially parallel to the substrate.

A MOM capacitor as well as a MOS capacitor are examples of VPP capacitors. MOM capacitors are one of the most widely used capacitors due to their beneficial characteristics. In particular, MOM capacitors are typically used for providing high quality capacitors in semiconductor processes without incurring the cost of an extra processing step relative to other capacitor structures. MOM capacitor structures realize capacitance by using the fringing capacitance produced by sets of interdigitated fingers. That is, MOM capacitors harness lateral capacitive coupling between plates formed by metallization layers and wiring traces.

The design of mobile RF transceivers may include integrating MOM/MOS/MIM capacitors with inductors and/or transformers. Unfortunately, integrating MOM/MOS/MIM capacitors with inductors and/or transformers may degrade performance of the inductors and/or transformers. Consequently, conventional arrangements for implementing multi-turn inductors continue to consume unused area in RF integrated circuit (RFIC) analog devices.

Various aspects of the disclosure provide a capacitor array integrated within an inductor area, which is conventionally unused. The process flow for fabrication of the capacitor array and inductor may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described, the term "substrate" may refer to a substrate of a diced wafer or may refer to a substrate of a wafer that is not diced. Similarly, the terms chip and die may be used interchangeably.

As described, the back-end-of-line interconnect layers may refer to the conductive interconnect layers (e.g., a first interconnect layer (M1) or metal one M1, metal two (M2), metal three (M3), metal four (M4), etc.) for electrically coupling to front-end-of-line active devices of an integrated circuit. The various back-end-of-line interconnect layers are formed at corresponding back-end-of-line interconnect levels, in which lower back-end-of-line interconnect levels use thinner metals layers relative to upper back-end-of-line interconnect levels. The back-end-of-line interconnect layers may electrically couple to middle-of-line interconnect layers, for example, to connect M1 to an oxide diffusion (OD) layer of an integrated circuit. The middle-of-line interconnect layer may include a zero interconnect layer (M0) for connecting M1 to an active device layer of an integrated circuit. A back-end-of-line first via (V2) may connect M2 to M3 or others of the back-end-of-line interconnect layers.

In practice, inductors/transformers are commonly used in radio frequency integrated circuits (RFICs). These inductors/transformers are generally formed at the upper back-end-of-line (BEOL) interconnect levels because the upper BEOL interconnect levels provide thicker metal layers relative to the lower BEOL interconnect levels for achieving a desired inductance. These inductors/transformers, however, occupy significant semiconductor area due to the thick metal layers provided by the upper BEOL interconnect levels. Unfortunately, adding circuits/capacitors below these inductors/capacitors normally decreases an inductor quality (Q)-factor.

Aspects of the present disclosure describe a capacitor array for reusing an area below the inductors/transformers, while maintaining an inductor Q-factor. For example, the inductor may be fabricated at an upper BEOL interconnect level (e.g., M5). Conventionally, the area in a lower BEOL interconnect level (e.g., M1-M4) is unused because occupying this area generally degrades the inductor's Q-factor.

According to aspects of the present disclosure, a capacitor array may be formed in the lower BEOL interconnect levels, without degrading the inductor's Q-factor. In this way, a perimeter defined by a trace of the inductor may overlap and possibly enclose the capacitor array. In addition, a pair of manifolds (e.g., capacitor routing terminals) of the capacitor array may be proximate one another, and outside of the capacitor array and the perimeter defined by the inductor trace.

FIG. 1 is a schematic diagram of a radio frequency (RF) front end (RFFE) module 100 employing passive devices including a capacitor 116 (e.g., a capacitor array) integrated within an inductor area of an inductor 118. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
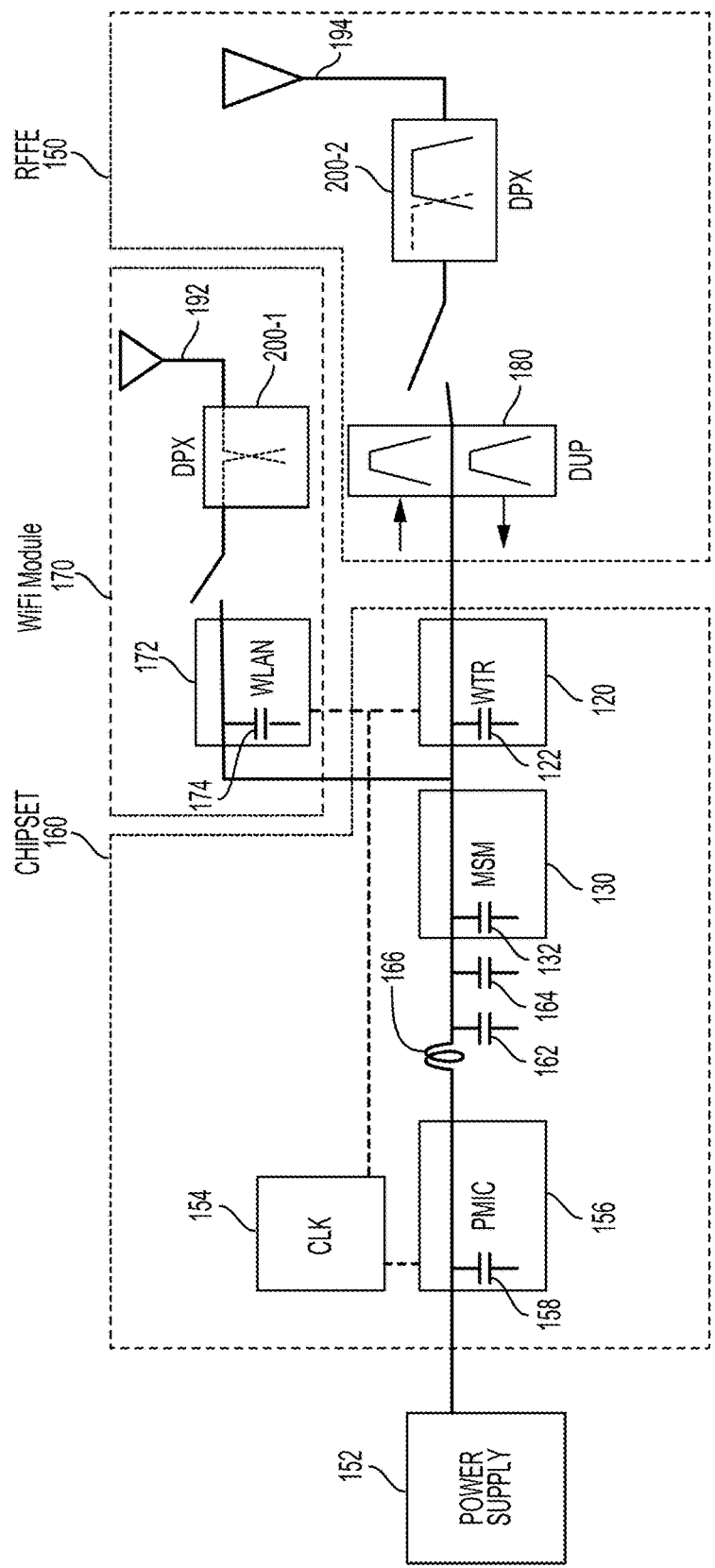
FIG. 2 is a schematic diagram of a radio frequency (RF) front end (RFFE) module employing passive devices for a chipset.

FIG. 2 is a schematic diagram of a wireless local area network (WLAN) (e.g., WiFi) module 170 including a first diplexer 200-1 and an RF front end (RFFE) module 150 including a second diplexer 200-2 for a chipset 160, including a capacitor array integrated within an inductor area. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity.

The PMIC 156, the modem 130, the wireless transceiver 120, and the WLAN module 172 each include capacitors (e.g., 158, 132, 122, and 174) and operate according to a clock 154. In addition, the inductor 166 couples the modem 130 to the PMIC 156. The geometry and arrangement of the various capacitors and inductors in the chipset 160 may consume substantial chip area. The design of the chipset 160 likely includes integrating MOM/MIM/MOS capacitors with inductors and/or transformers. Unfortunately, integrating MOM/MIM/MOS capacitors with inductors and/or transformers may degrade performance of the inductors and/or transformers. Consequently, conventional arrangements for implementing multi-turn inductors continue to consume unused area in RF integrated circuit (RFIC) analog devices.

Figure 3:
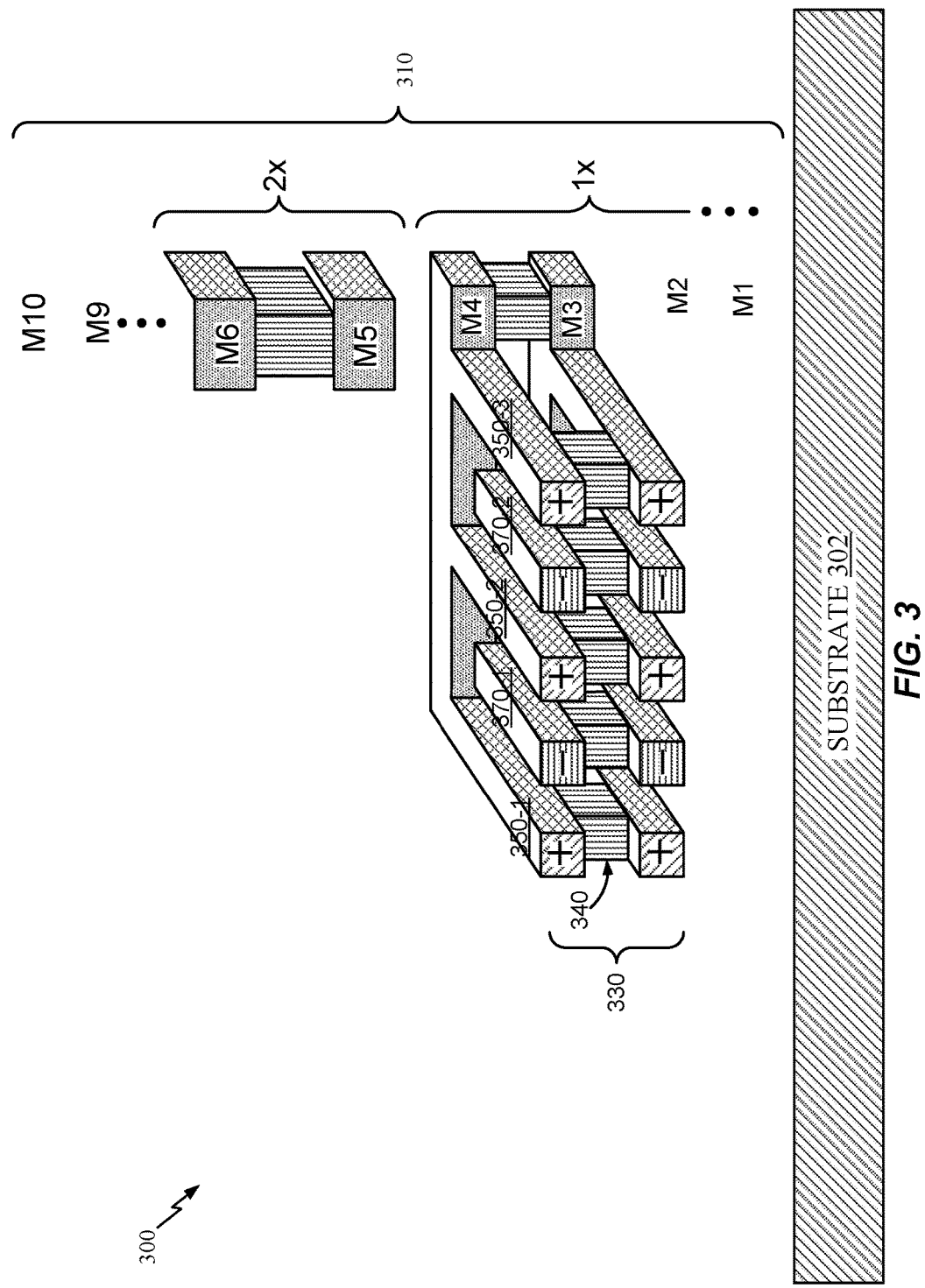
FIG. 3 is a cross section illustrating an integrated circuit (IC) device including an interconnect stack that contains conventional metal-oxide-metal (MOM) capacitor structures.

Capacitors are widely used in analog integrated circuits. FIG. 3 is a block diagram illustrating a cross section of an analog integrated circuit (IC) device 300 including an interconnect stack 310. The interconnect stack 310 of the IC device 300 includes multiple conductive interconnect layers (M1, . . . , M9, M10) on a semiconductor substrate (e.g., a diced silicon wafer) 302. The semiconductor substrate 302 support a metal-oxide-metal (MOM) capacitor 330 and/or a metal-oxide-semiconductor (MOS). In this example, the MOM capacitor 330 is formed in the M3 and M4 interconnect layers, below the M5 and M6 interconnect layers. The MOM capacitor 330 is formed from lateral conductive fingers of different polarities using the conductive interconnect layers (M3 and M4) of the interconnect stack 310. A dielectric (not shown) is provided between the conductive fingers.

In this example, the MOM capacitor 330 is formed within the lower conductive interconnect layers (e.g., M1-M4) of the interconnect stack 310. The lower conductive interconnect layers of the interconnect stack 310 have smaller interconnect widths and spaces. For example, the dimensions of the conductive interconnect layers M3 and M4 are half the size of the dimensions of the conductive interconnect layers M5 and M6. Likewise, the dimensions of the conductive interconnect layers M1 and M2 are half the size of the dimensions of the conductive interconnect layers M3 and M4. The small interconnect widths and spaces of the lower conductive interconnect layers enable the formation of MOM capacitors with increased capacitance density.

As shown in FIG. 3, the MOM capacitor 330 makes use of a lateral (intra layer) capacitive coupling 340 between fingers (e.g., 350, 370) formed by standard metallization of the conductive interconnects (e.g., wiring lines and vias). In aspects of the present disclosure, one or more of the MOM/MIM/MOS capacitor arrays may be integrated within an inductor area, as shown in FIG. 4.

Figure 4:
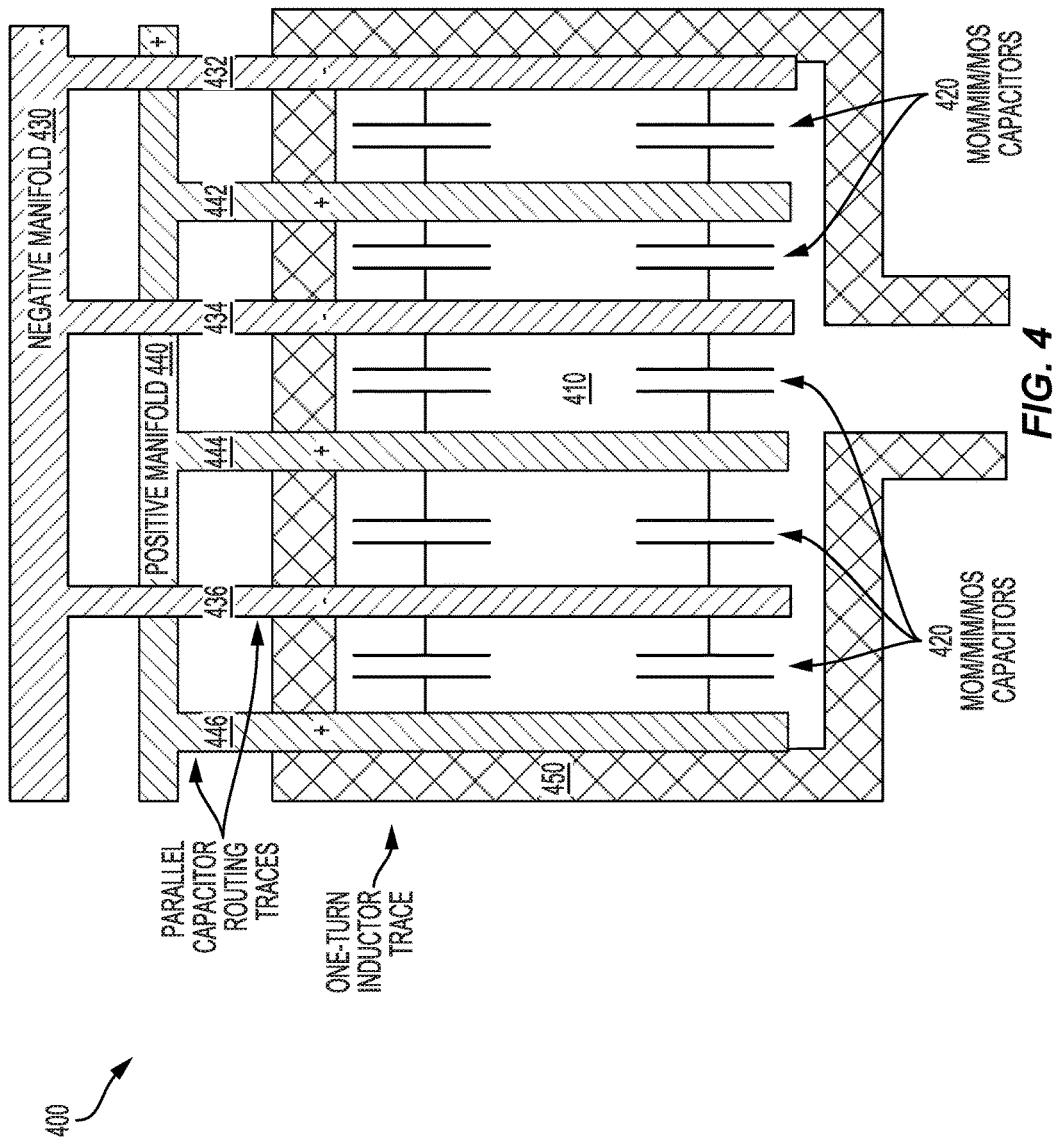
FIG. 4 is a schematic diagram illustrating a top view of an on-chip inductor/transformer that overlaps a capacitor array, according to aspects of the present disclosure.

FIG. 4 is a schematic diagram illustrating a top view of an on-chip inductor/transformer that overlaps a capacitor array, according to aspects of the present disclosure. Representatively, a radio frequency integrated circuit (RFIC) 400 includes an on-chip inductor/transformer that is shown as a one-turn inductor trace (e.g., inductor trace 450) formed in an upper back-end-of-line (BEOL) interconnect level (e.g., M5-M8). The upper BEOL interconnect level may begin at a fifth BEOL interconnect level (M5). In this example, a capacitor array 410 is fabricated in lower BEOL interconnect levels (e.g., M1-M4). Although the upper and lower BEOL interconnect levels are described with reference to particular BEOL interconnect levels, it should be understood that other ranges are contemplated according to aspects of the present disclosure.

In this aspect of the present disclosure, the capacitor array 410 includes capacitors 420 fabricated within an inductor area defined by a perimeter of the inductor trace 450. The capacitors 420 of the capacitor array 410 are coupled between positive (e.g., 442, 444, 446) and negative (e.g., 432, 434, 436) parallel capacitor routing traces. For example, each pair of parallel capacitor routing traces includes capacitors 420 coupled there between. It should be recognized that number of the positive (e.g., 442, 444, 446) and negative (e.g., 432, 434, 436) parallel capacitor routing traces shown is merely exemplary, as more or fewer parallel capacitor routing traces are contemplated according to aspects of the present disclosure.

In this aspect of the present disclosure, a positive capacitor manifold 440 is coupled to the positive parallel capacitor routing traces (e.g., 442, 444, 446). In addition, a negative capacitor manifold 430 is coupled to the negative parallel capacitor routing traces (e.g., 432, 434, 436). In this example, the positive capacitor manifold 440 is placed proximate to the negative capacitor manifold 430, and both manifolds are outside the perimeter of the inductor trace 450. This arrangement of the capacitor manifolds (e.g., 430, 440) prevents the capacitor array 410 from negatively affecting the Q-factor of the inductor trace 450 by avoiding forming of a loop current within the capacitor array 410 when the negative capacitor manifold 430 and the positive capacitor manifold 440 are placed on opposite sides of the capacitor array 410. The capacitor manifolds (e.g., 430, 440) can also be within the perimeter of the inductor traces 450 in same configurations. Although the inductor trace 450 is shown as having one turn in FIG. 4, it should be recognized that aspects of the present disclosure contemplate multi-turn inductors.

Although shown as perpendicular and/or parallel relative to the inductor trace 450, the positive and negative parallel capacitor routing traces (e.g., 442, 444, 446, 432, 434, 436) may be placed at any angle relative to the inductor trace 450. As shown in FIG. 4, the positive and negative parallel capacitor routing traces (e.g., 442, 444, 446, 432, 434, 436) are parallel at some location and perpendicular at some other locations relative to the inductor trace 450. In addition, although the positive and negative parallel capacitor routing traces (e.g., 442, 444, 446, 432, 434, 436) are shown perpendicular to the positive and negative capacitor manifolds (e.g., 430 and 440), it should be recognized that an angle between the routing traces and the manifolds may include angles other than ninety degrees (90°).

FIGS. 5A-5D are schematic diagrams further illustrating the on-chip inductor/transformer that overlaps a capacitor array of FIG. 4, according to aspects of the present disclosure.

Figure 5:
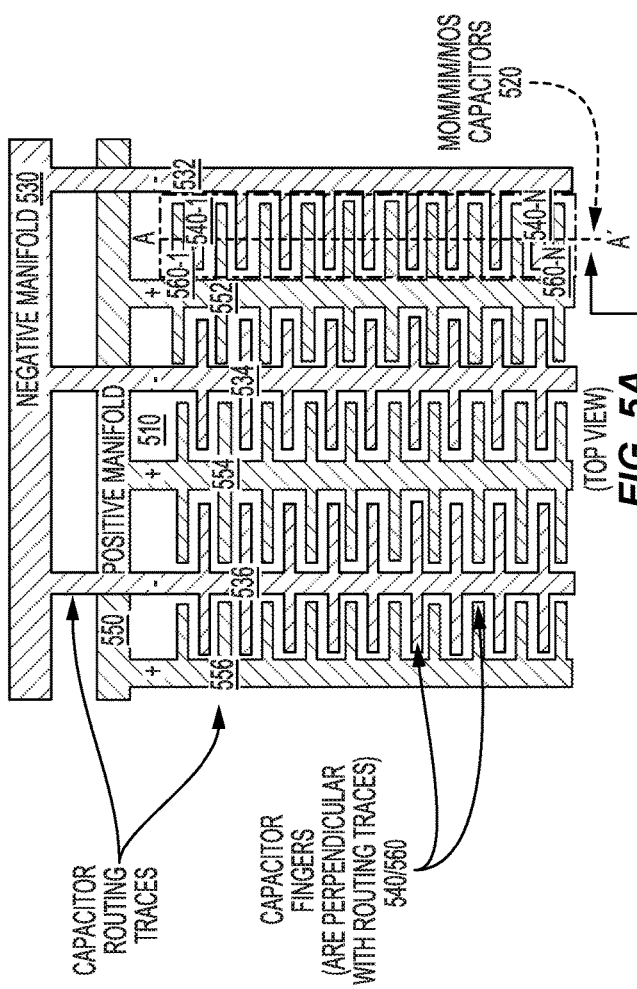
FIGS. 5A-5D are schematic diagrams further illustrating the on-chip inductor/transformer/capacitor array of FIG. 4, according to aspects of the present disclosure.

FIG. 5A is a top view of the on-chip inductor/transformer/capacitor array of FIG. 4, in which the inductor trace is not shown to further illustrate the MOM/MIM/MOS capacitors, according to aspects of the present disclosure. In this configuration, a capacitor array 510 includes capacitors 520 coupled between positive (e.g., 552, 554, 556) and negative (e.g., 532, 534, 536) parallel capacitor routing traces. For example, each pair of parallel capacitor routing traces includes capacitors 520 coupled there between. It should be recognized that number of the positive (e.g., 552, 554, 556) and negative (e.g., 532, 534, 536) parallel capacitor routing traces shown is merely exemplary, as more or fewer parallel capacitor routing traces are contemplated according to aspects of the present disclosure.

In this example, a positive capacitor manifold 550 is coupled to the positive parallel capacitor routing traces (e.g., 552, 554, 556). A negative capacitor manifold 530 is also coupled to the negative parallel capacitor routing traces (e.g., 532, 534, 536). In this example, the positive capacitor manifold 550 and the negative capacitor manifold 530 may be arranged as shown in FIG. 4 (e.g., proximate one another and outside the perimeter of the capacitor array 510). In the configuration shown in FIG. 5A, capacitor fingers 540/560 are coupled to the positive (e.g., 552, 554, 556) and negative (e.g., 532, 534, 536) parallel capacitor routing traces, respectively. The various capacitors formed in the capacitor array 510 are illustrated in FIGS. 5B-5D, as cross-section views along a line A-A'.

FIG. 5B is a cross-section view along the line A-A' of the capacitor array 510 illustrating a first capacitor type, according to aspects of the present disclosure. In this example, the capacitor array 510 includes a metal oxide metal (MOM) capacitor 570. The MOM capacitor 570 is formed from multiple layers of the capacitor fingers 540/560. For example, positive capacitor fingers 560 (560-1, . . . , 560-N) are coupled together over a substrate 502 (e.g., a semiconductor substrate). In addition, negative capacitor fingers 540 (540-1, . . . , 540-N) are coupled together over the substrate 502. A dielectric layer (not shown) may be deposited between the capacitor fingers 540/560 to complete formation of the MOM capacitor 570, for example, within a first interconnect layer M1 and a fourth interconnect layer M4.

FIG. 5C is a cross-section view along the line A-A' of the capacitor array 510 of FIG. 5A, illustrating a second capacitor type, according to aspects of the present disclosure. In this example, the capacitor array 510 includes the MOM capacitor 570 stacked on a metal oxide semiconductor (MOS) capacitor 580 to from a MOM on MOS capacitor 590. The MOS capacitor 570 is formed from source (S)/drain (D) contacts as well as a gate (G) contact. In this example, the positive capacitor fingers 560 and the negative capacitor fingers 540 are interconnected with the S/D contacts and the gate (G) contact for completing the MOM on MOS capacitor 590.

FIG. 5D is a cross-section view along the line A-A' of the capacitor array 510 of FIG. 5A, illustrating a third capacitor type, according to aspects of the present disclosure. In this example, the capacitor array 510 includes the MOS capacitor 580. The MOS capacitor 580 is formed to include source (S)/drain (D) contacts as well as a gate (G) contact. In this example, the positive capacitor fingers 560 and the negative capacitor fingers 540 are interconnected with the S/D contacts and the G contact to complete formation of the MOS capacitor 580.

Figure 6:
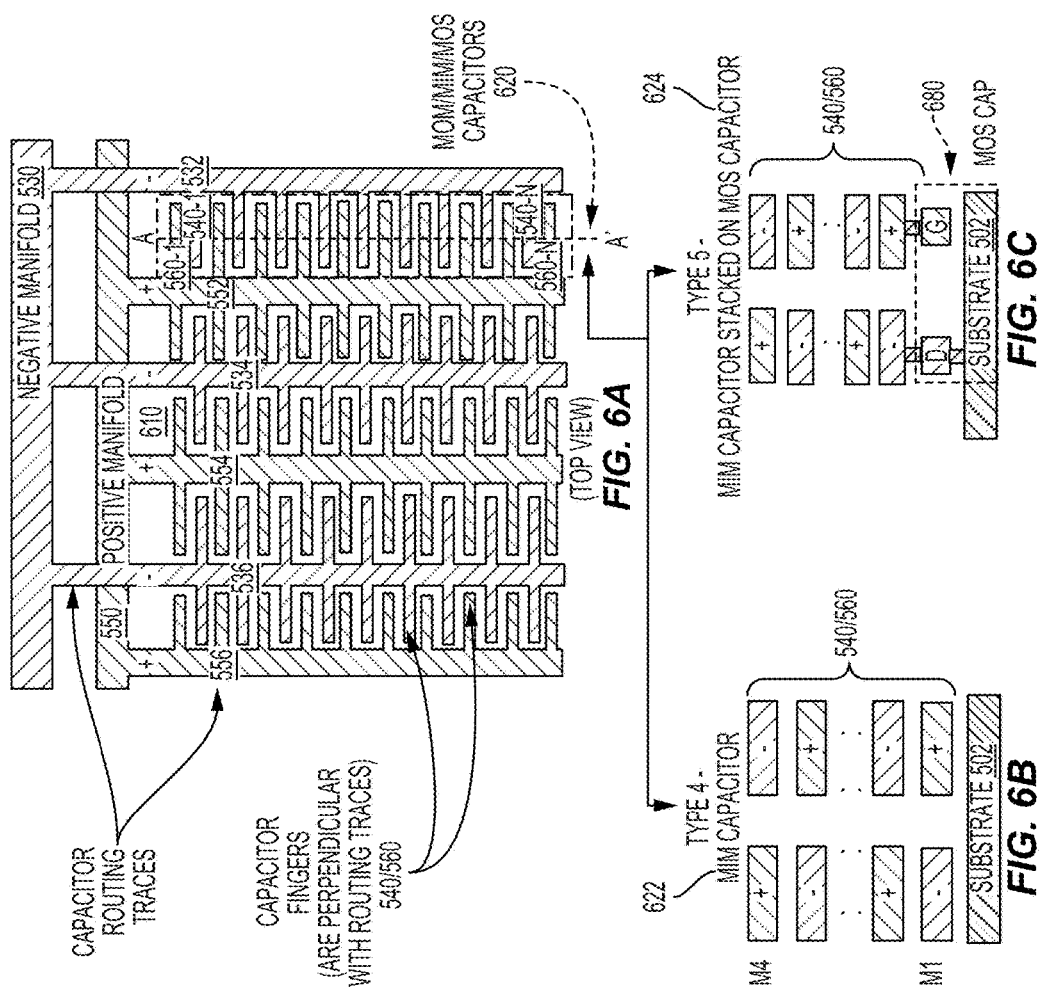
FIGS. 6A-6C are schematic diagrams further illustrating the on-chip inductor/transformer/capacitor array of FIG. 4, according to aspects of the present disclosure.

FIGS. 6A-6C are schematic diagrams further illustrating the on-chip inductor/transformer/capacitor array of FIG. 4, according to aspects of the present disclosure.

FIG. 6A is a top view of the on-chip inductor/transformer that overlaps a capacitor array of FIG. 5A, in which the inductor trace is not shown to further illustrate the MOM/MIM/MOS capacitors, according to aspects of the present disclosure. In this configuration, the capacitor fingers 540/560 are coupled to the positive (e.g., 552, 554, 556) and negative (e.g., 532, 534, 536) parallel capacitor routing traces, respectively. The various capacitors that may be formed in a capacitor array 610 are illustrated in FIGS. 6B and 6C, as cross-section views along a line A-A' of the capacitor array 610.

FIG. 6B is a cross-section view along the line A-A' of the capacitor array 610 of FIG. 6A, illustrating a fourth capacitor type, according to aspects of the present disclosure. In this example, the capacitor array 610 includes a metal-insulator-metal (MIM) capacitor 622. The MIM capacitor 622 is formed from multiple layers of the capacitor fingers 540/560, which may a first capacitor plate and a second capacitor plate of the MIM capacitor 622. For example, the positive capacitor fingers 560 (560-1, . . . , 560-N) and the negative capacitor fingers 540 (540-1, . . . , 540-N) may be stacked over the substrate 502 (e.g., a semiconductor substrate) to form the MIM capacitor 622. In addition, a dielectric layer (not shown) may be deposited between the capacitor fingers 540/560 to complete formation of the MIM capacitor 622.

FIG. 6C is a cross-section view along the line A-A' of the capacitor array 610 of FIG. 6A, illustrating a fifth capacitor type, according to aspects of the present disclosure. In this example, the capacitor array 610 includes the MIM capacitor 622 stacked on a MOS capacitor 680 to from a MIM on MOS capacitor 624. In this configuration, the MOS capacitor 570 is formed to include a drain (D) contact and a gate (G) contact. In this example, the positive capacitor fingers 560 and the negative capacitor fingers 540 are interconnected with the D contact and the G contact for completing the MIM on MOS capacitor 624.

Figure 7:
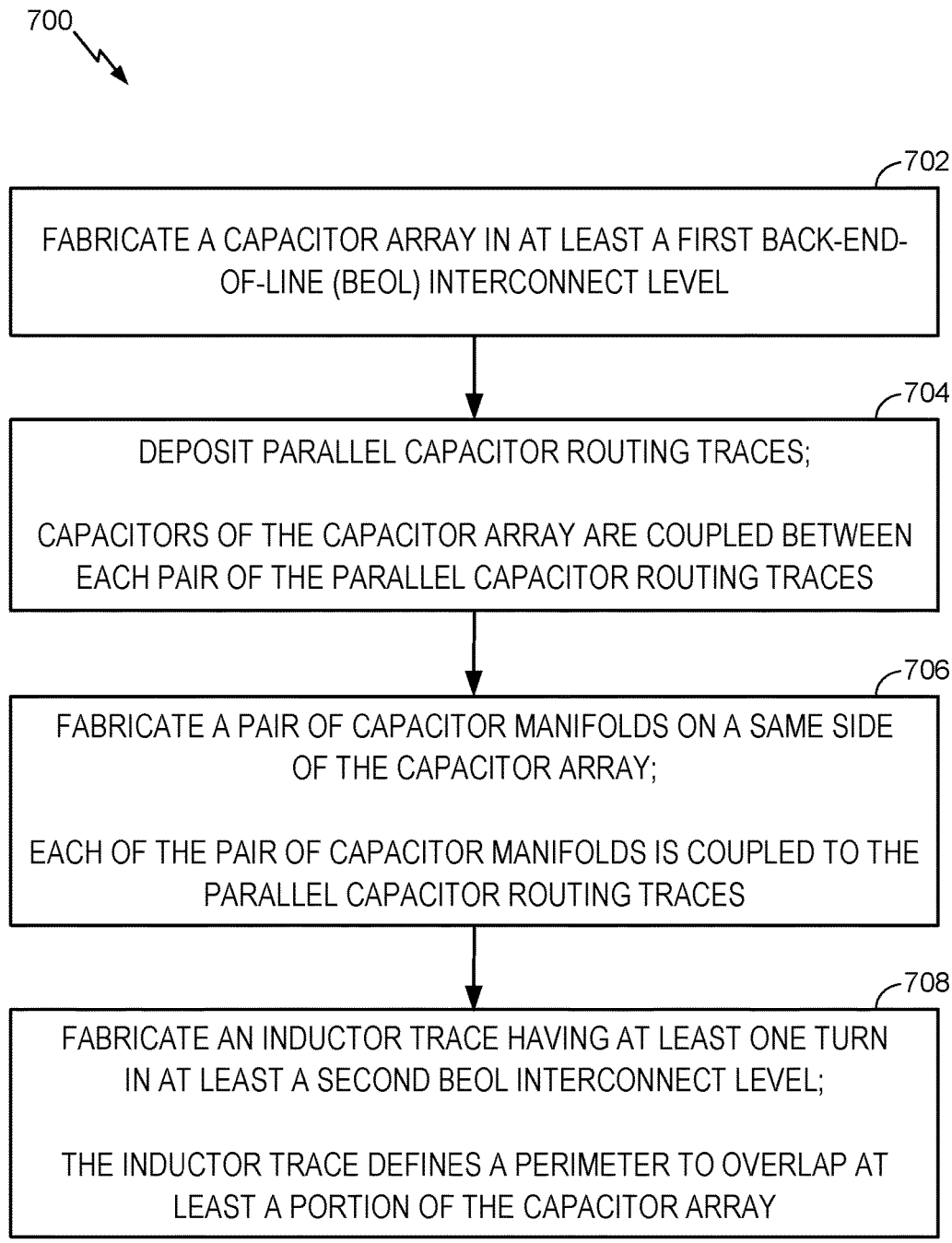
FIG. 7 is a process flow diagram illustrating a method for fabricating a radio frequency integrated circuit (RFIC) having a capacitor array integrated within an inductor area, according to an aspect of the present disclosure.

In this aspect of the present disclosure, an inductor trace 450 (FIG. 4) defines a perimeter of an inductor area that overlaps at least a capacitor array (e.g., 410/510/610) for maintaining the Q-factor of the inductor trace 450, which may be fabricated as shown in FIG. 7.

FIG. 7 is a process flow diagram illustrating a method 700 for fabricating a radio frequency integrated circuit (RFIC), according to an aspect of the present disclosure. In block 702, a capacitor array is fabricated in at least one first back-end-of-line (BEOL) interconnect level. For example, as shown in FIG. 4, the capacitor array 410, including capacitors 420, is fabricated in lower interconnect levels (e.g., M1-M4). In block 704, parallel capacitor routing traces are deposited. Capacitors of the capacitor array are coupled between each pair of the parallel capacitor routing traces. For example, as shown in FIG. 4, the capacitors 420 are coupled between the positive (e.g., 442, 444, 446) and the negative (e.g., 432, 434, 436) parallel capacitor routing traces.

In block 706, a pair of capacitor manifolds are fabricated on a same side of the capacitor array. Each of the pair of capacitor manifolds is coupled to the parallel capacitor routing traces. As shown in FIG. 4, a positive capacitor manifold 440 is coupled to the positive parallel capacitor routing traces (e.g., 442, 444, 446). In addition, the negative capacitor manifold 430 is coupled to the negative parallel capacitor routing traces (e.g., 432, 434, 436). In this example, the positive capacitor manifold 440 is proximate to the negative capacitor manifold 430, and both manifolds are outside the perimeter of the inductor trace 450. In alternate configurations (not shown), the positive and negative capacitor manifolds are inside the perimeter of the inductor trace or on a different side (e.g., the left side of the top view diagram rather than the top side as seen in the top view diagram of FIG. 4.) In block 708, an inductor trace is fabricated with at least one turn in at least one second BEOL interconnect level. The inductor trace defines a perimeter overlapping at least a portion of the capacitor array. As shown in FIG. 4, the inductor trace 450 is fabricated in upper BEOL interconnect levels (e.g., M5-M8) and defines a perimeter of an inductor area that overlaps at least the capacitor array 410.

According to a further aspect of the present disclosure, an RFIC includes a capacitor array within an inductor area defined by a perimeter of an inductor trance. In one configuration, the RFIC has means for routing capacitor fingers. In one configuration, the capacitor finger routing means may be the positive (e.g., 442, 444, 446) parallel capacitor routing traces and the negative (e.g., 432, 434, 436) parallel capacitor routing traces, as shown in FIG. 4. In another aspect, the aforementioned means may be any structure or any material configured to perform the functions recited by the aforementioned means.

Figure 8:
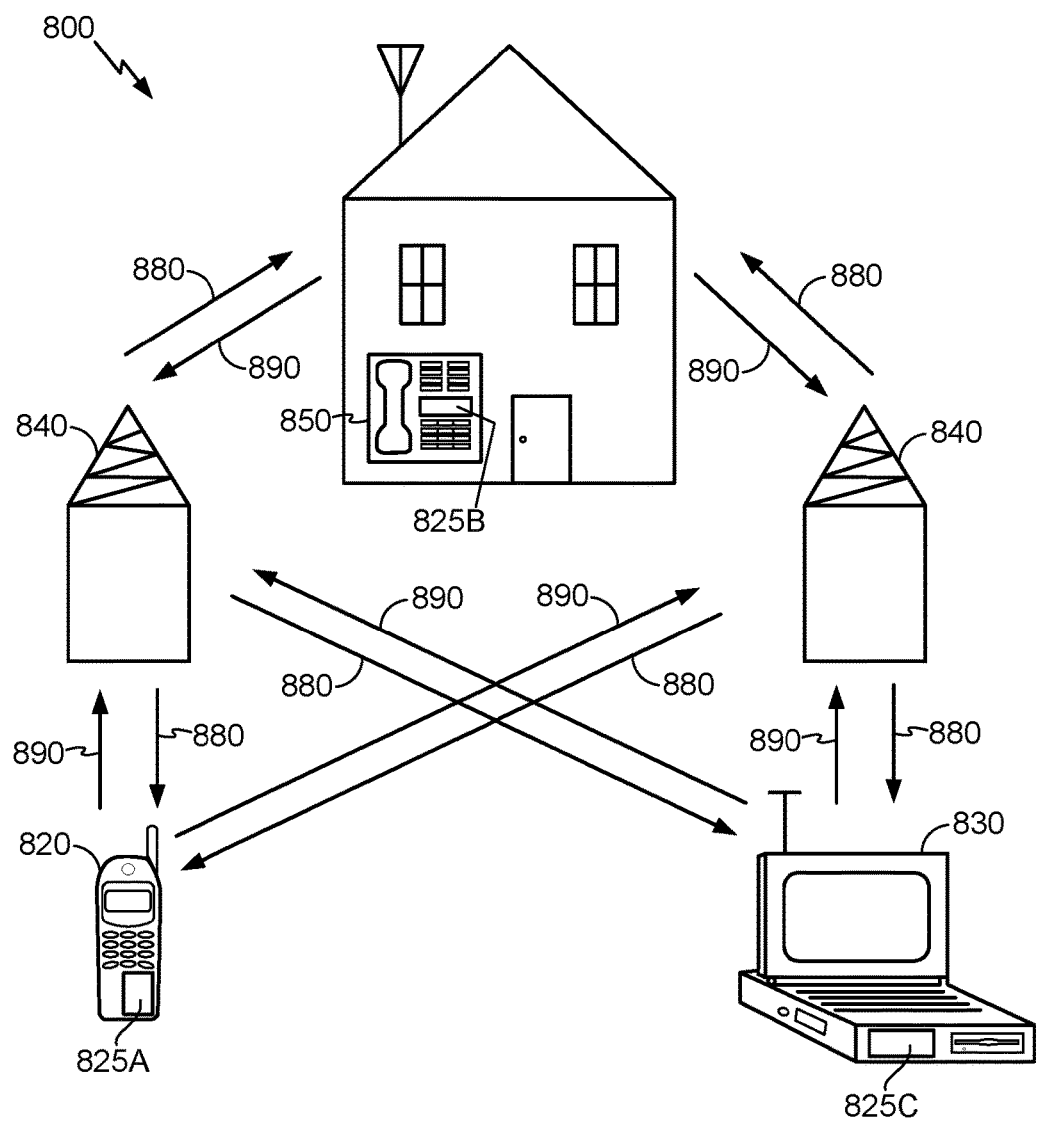
FIG. 8 is a block diagram showing an exemplary wireless communication system in which a configuration of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C, and 825B that include the disclosed inductor/transformer/capacitor array. It will be recognized that other devices may also include the disclosed inductor/transformer/capacitor array, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as a meter reading equipment, or other device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the disclosed inductor/transformer/capacitor array.

Figure 9:
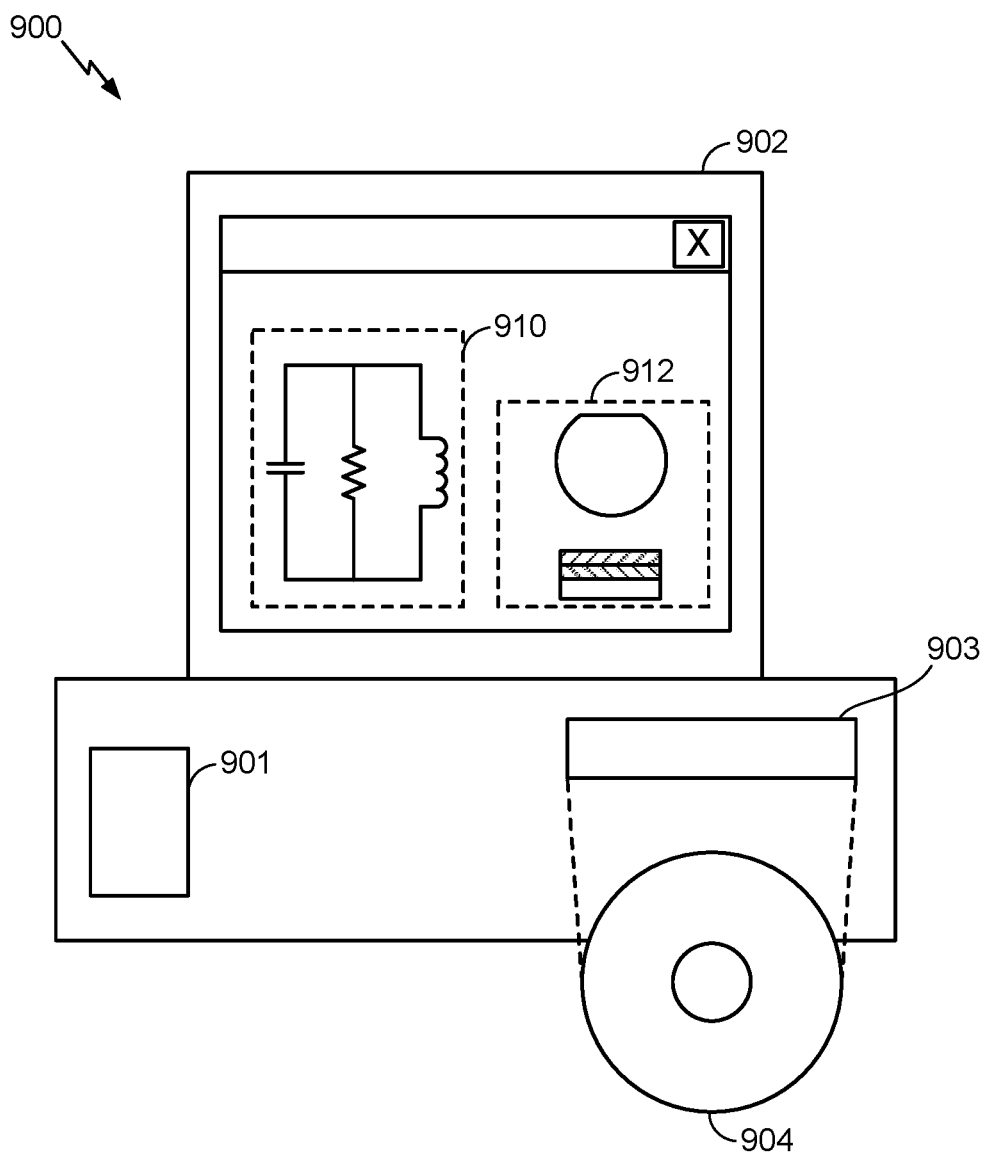
FIG. 9 is a block diagram illustrating a design workstation used for circuit, layout, and logic design of a semiconductor component according to one configuration.

FIG. 9 is a block diagram illustrating a design workstation used for circuit, layout, and logic design of a semiconductor component, such as the capacitors disclosed above. A design workstation 900 includes a hard disk 901 containing operating system software, support files, and design software such as Cadence or OrCAD. The design workstation 900 also includes a display 902 to facilitate design of a circuit 910 or an RF component 912 such as a inductor/transformer/capacitor array. A storage medium 904 is provided for tangibly storing the design of the circuit 910 or the RF component 912 (e.g., the inductor/transformer/capacitor array). The design of the circuit 910 or the RF component 912 may be stored on the storage medium 904 in a file format such as GDSII or GERBER. The storage medium 904 may be a CD-ROM, DVD, hard disk, flash memory, or other appropriate device. Furthermore, the design workstation 900 includes a drive apparatus 903 for accepting input from or writing output to the storage medium 904.

Data recorded on the storage medium 904 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 904 facilitates the design of the circuit 910 or the RF component 912 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An integrated circuit (IC), comprising:
a semiconductor substrate;
a capacitor array in at least one first back-end-of-line (BEOL) interconnect level, the capacitor array having a pair of capacitor manifolds coupled to a plurality of parallel capacitor routing traces, a plurality of capacitors coupled between each pair of parallel capacitor routing traces, one of the plurality of capacitors stacked on a base capacitor in direct contact with the semiconductor substrate; and
an inductor trace having at least one turn in at least one second BEOL interconnect level, the inductor trace defining a perimeter to overlap at least a portion of the capacitor array.

2. The IC of claim 1, in which the pair of capacitor manifolds are at a same side of the capacitor array, outside the perimeter defined by the inductor trace.

3. The IC of claim 1, in which the plurality of capacitors comprise a metal-oxide-metal (MOM) capacitor, comprising interdigitated fingers alternately coupled between a pair of the plurality of parallel capacitor routing traces.

4. The IC of claim 1, in which the plurality of capacitors comprise a metal-oxide-semiconductor (MOS) capacitor, comprising a source (S)/drain (D) contact coupled to a first of the plurality of parallel capacitor routing traces and a gate (G) contact coupled to a second of the plurality of parallel capacitor routing traces.

5. The IC of claim 1, in which the plurality of capacitors comprise a metal-insulator-metal (MIM) capacitor, comprising a first capacitor plate coupled to a first of the plurality of parallel capacitor routing traces and a second capacitor plate coupled to a second of the plurality of parallel capacitor routing traces, in which the first capacitor plate is arranged to overlap at least a portion of the second capacitor plate.

6. The IC of claim 1, in which:
the base capacitor comprises a metal-oxide-semiconductor (MOS) capacitor on the semiconductor substrate; and
the one of the plurality of capacitors comprises a metal-oxide-metal (MOM) capacitor stacked on the MOS capacitor.

7. The IC of claim 1, in which
the base capacitor comprises a metal-oxide-semiconductor (MOS) capacitor on the semiconductor substrate; and
the one of the plurality of capacitors comprises a metal-insulator-metal (MIM) capacitor stacked on the MOS capacitor.

8. The IC of claim 1, in which the at least one first BEOL interconnect level comprises a lower BEOL interconnect level and the at least one second BEOL interconnect level comprises an upper BEOL interconnect level.

9. The IC of claim 1, in which the pair of capacitor manifolds are at a same side of the capacitor array, inside the perimeter defined by the inductor trace.

10. The IC of claim 1, integrated into a mobile phone, a set top box, a music player, a video player, an entertainment unit, a navigation device, a computer, a hand-held personal communication systems (PCS) unit, a portable data unit, and/or a fixed location data unit.

11. A method for fabricating a radio frequency integrated circuit (RFIC), comprising:
fabricating a base capacitor in direct contact with a semiconductor substrate;
fabricating a capacitor array of a plurality of capacitors in at least one first back-end-of-line (BEOL) interconnect level;
stacking one of the plurality of capacitors on the base capacitor;

depositing a plurality of parallel capacitor routing traces, the plurality of capacitors of the capacitor array coupled between each pair of the plurality of parallel capacitor routing traces;

fabricating a pair of capacitor manifolds on a same side of the capacitor array, each of the pair of capacitor manifolds coupled to the plurality of parallel capacitor routing traces; and fabricating an inductor trace having at least one turn in at least one second BEOL interconnect level, the inductor trace defining a perimeter to overlap at least a portion of the capacitor array.

12. The method of claim 11, in which fabricating the capacitor array comprises:

fabricating a plurality of metal-oxide-metal (MOM) capacitors as the plurality of capacitors of the capacitor array; and stacking the plurality of MOM capacitors on a plurality of metal oxide semiconductor (MOS) capacitors including the base capacitor.

13. The method of claim 11, in which fabricating the capacitor array comprises:

fabricating a plurality of metal-insulator-metal (MIM) capacitors as the plurality of capacitors of the capacitor array; and stacking the plurality of MIM capacitors on a plurality of metal oxide semiconductor (MOS) capacitors including the base capacitor.

14. The method of claim 11, in which the pair of capacitor manifolds are outside the perimeter of the inductor trace.

15. The method of claim 11, in which the RFIC is integrated into a mobile phone, a set top box, a music player, a video player, an entertainment unit, a navigation device, a computer, a hand-held personal communication systems (PCS) unit, a portable data unit, and/or a fixed location data unit.

16. A radio frequency integrated circuit (RFIC), comprising:

a semiconductor substrate;

a capacitor array in at least one first back-end-of-line (BEOL) interconnect level, the capacitor array having a pair of capacitor manifolds on a same side of the capacitor array, each of the pair of capacitor routing manifolds coupled to means for routing capacitor fingers, a plurality of capacitors coupled between the means for routing capacitor fingers, one of the plurality of capacitors stacked on a base capacitor in direct contact with the semiconductor substrate; and an inductor trace having at least one turn in at least one second BEOL interconnect level, the inductor trace defining a perimeter to overlap at least a portion of the capacitor array.

17. The RFIC of claim 16, in which the pair of capacitor manifolds are at a same side of the capacitor array, outside the perimeter defined by the inductor trace.

18. The RFIC of claim 16, in which the plurality of capacitors comprises a metal-oxide-metal (MOM) capacitor and/or a metal-insulator-metal (MIM) capacitor.

19. The RFIC of claim 16, in which the at least one first BEOL interconnect level comprises a lower BEOL interconnect level and the at least one second BEOL interconnect level comprises an upper BEOL interconnect level.

20. The RFIC of claim 16, integrated into a mobile phone, a set top box, a music player, a video player, an entertainment unit, a navigation device, a computer, a hand-held personal communication systems (PCS) unit, a portable data unit, and/or a fixed location data unit.

* * * * *